(12) United States Patent
Ayel

(10) Patent No.: US 11,982,565 B2
(45) Date of Patent: May 14, 2024

(54) SPAD PHOTODIODE CONTROL CIRCUIT

(71) Applicant: Commissariat à l'Énergie Atomique et aux Énergies Alternatives, Paris (FR)

(72) Inventor: François Ayel, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 638 days.

(21) Appl. No.: 17/170,563

(22) Filed: Feb. 8, 2021

(65) Prior Publication Data

US 2021/0265512 A1 Aug. 26, 2021

(30) Foreign Application Priority Data

Feb. 26, 2020 (FR) ...................................... 2001884

(51) Int. Cl.
*G01J 1/44* (2006.01)

(52) U.S. Cl.
CPC ........... *G01J 1/44* (2013.01); *G01J 2001/442* (2013.01); *G01J 2001/4466* (2013.01)

(58) Field of Classification Search
CPC ................. G01J 1/44; G01J 2001/442; G01J 2001/4466; H01L 31/02027; H03K 17/04
See application file for complete search history.

(56) References Cited

U.S. PATENT DOCUMENTS

| 2006/0027736 | A1 | 2/2006 | Ichino et al. | |
| 2020/0045255 | A1* | 2/2020 | Li | H04N 25/60 |
| 2022/0137194 | A1* | 5/2022 | Tayu | G01S 17/89 |
| | | | | 356/4.01 |
| 2022/0163642 | A1* | 5/2022 | Kamizuru | G01J 1/42 |

OTHER PUBLICATIONS

Preliminary Search Report for French Application No. 2001884, dated Nov. 2, 2020.
Yu et al., A review of quenching circuit design based on Geiger-mode APD. Proceedings of 2018 IEEE International Conference on Mechatronics and Automation (ICMA). Aug. 5, 2018:28-33.

* cited by examiner

*Primary Examiner* — Thanh Luu
*Assistant Examiner* — Monica T Taba
(74) *Attorney, Agent, or Firm* — Wolf, Greenfield & Sacks, P.C.

(57) ABSTRACT

The present disclosure concerns a SPAD photodiode control circuit, including: a first current source; a current mirror including an input transistor in series with the first current source and an output transistor in series with the SPAD photodiode and a second current source in series with the input transistor of the current mirror and in parallel with the first current source, the second current source being alternately controllable to a so-called inactive state where it delivers no current and to a so-called active state where it delivers a non-zero current which adds, in the input transistor of the current mirror, to a current delivered by the first current source.

13 Claims, 5 Drawing Sheets

SPAD PHOTODIODE CONTROL CIRCUIT

CROSS-REFERENCE TO RELATED APPLICATIONS

This application claims priority to French patent application number 2001884, filed Feb. 26, 2020, the contents of which is incorporated herein by reference in its entirety.

TECHNICAL BACKGROUND

The present disclosure generally concerns electronic circuits, and more particularly aims at a circuit for controlling an avalanche photodiode for the detection of single photons, also called SPAD "Single Photon Avalanche Diode") photodiode.

PRIOR ART

A SPAD photodiode is essentially formed by a PN junction reverse biased at a voltage greater than its avalanche threshold. When no electric charge is present in the depletion area or space charge area of the PN junction, the photodiode is in a non-conductive pseudo-steady state. When a photo-generated electric charge is injected into the depletion area, if the displacement speed of this charge in the depletion area is sufficiently high, that is, if the electric field in the depletion area is sufficiently intense, the photodiode is capable of avalanching. A single photon is thus capable of generating a measurable electric signal, and this, with a very short response time. SPAD photodiodes enable to detect radiations of very low intensity, and are in particular used for single photon detection and photon counting.

A SPAD photodiode is conventionally associated with an electronic control circuit, particularly having the function of biasing the PN junction of the photodiode, of detecting when an avalanche of the photodiode is triggered, and of quenching—that is, interrupting—the avalanches of the photodiode once they have been triggered.

The implementation of a SPAD photodiode quenching function is here more particularly considered.

SUMMARY

An embodiment provides a SPAD photodiode control circuit, comprising:
  a first current source;
  a current mirror comprising an input transistor in series with the first current source and an output transistor in series with the SPAD photodiode; and
  a second current source in series with the input transistor of the current mirror and in parallel with the first current source, the second current source being alternately controllable to a so-called inactive state where it delivers no current, and to a so-called active state where it delivers a non-zero current which adds, in the input transistor of the current mirror, to a current delivered by the first current source.

According to an embodiment, the control circuit further comprises a feedback circuit configured to, after each triggering of an avalanche in the SPAD photodiode, control the second current source to the active state during a phase of resetting of the SPAD photodiode, and then control the second current source to the inactive state until the next triggering of an avalanche in the SPAD photodiode.

According to an embodiment, the feedback circuit is configured to introduce a predetermined delay between the triggering of an avalanche and the control to the active state of the second current source.

According to an embodiment, the feedback circuit has an input node coupled to an anode or cathode electrode of the SPAD photodiode, and an output node coupled to a control node of the second current source.

According to an embodiment, the input node of the feedback circuit is directly connected to the anode or cathode electrode of the photodiode.

According to an embodiment, the input node of the feedback circuit is connected to said anode or cathode electrode of the photodiode via a capacitive link.

According to an embodiment, the feedback circuit comprises a chain of inverters capable of propagating onto its output node a state change of a potential applied to its input node.

According to an embodiment, the chain of inverters comprises a delay inversion circuit.

According to an embodiment, the circuit further comprises a direct feedback transistor in series with the input transistor of the current mirror and in parallel with the first and second current sources, the direct feedback transistor having a control node connected to the input node of the feedback circuit.

According to an embodiment, the circuit further comprises a third current source connected between an output terminal of the first current source and a reference node, the third current source being controllable to a so-called active state where it delivers a non-zero current which subtracts, in the input transistor of the current mirror, to the current delivered by the first current source, and to a so-called inactive state where it delivers no current.

According to an embodiment, the feedback circuit is configured to, after each triggering of an avalanche in the SPAD photodiode, control the third current source to the active state before the beginning of the SPAD photodiode resetting phase, and then control the third current source to the inactive state during the resetting phase.

According to an embodiment, the third current source is a MOS transistor controllable to the active and to the inactive state via its gate.

According to an embodiment, the second current source is a MOS transistor controllable to the active state and to the inactive state via its gate.

According to an embodiment, the input and output transistors of the current mirror are MOS transistors, the gates of the input and output transistors of the current mirror being connected to each other and the drain and the gate of the input transistor of the current mirror being connected to each other.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the structure of the SPAD photodiodes likely to be used in combination with the described control circuits has not been detailed, the embodiments being compatible with all or most known SPAD photodiode structures. Further, the implementation of the functions of the control circuit other than the quenching function, for example, the readout function (avalanche detection), the bias function, etc. has not been detailed, the described embodiment being compatible with usual implementations of these functions.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

Unless specified otherwise, the expressions "around", "approximately", "substantially" and "in the order of" signify within 10%, and preferably within 5%.

Figure 1:
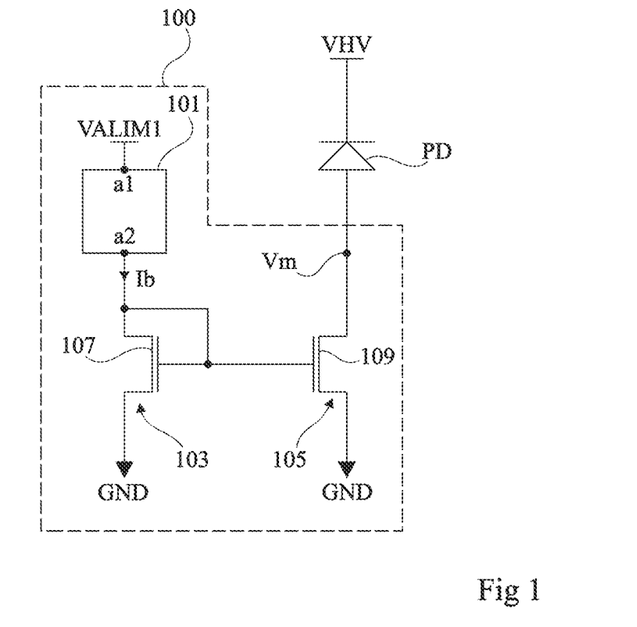
FIG. 1 schematically and partially shows an example of a SPAD photodiode control circuit.

FIG. 1 schematically and partially shows an example of a circuit 100 for controlling a SPAD photodiode PD.

Circuit 100 comprises current source 101, and a current mirror having an input branch 103 series-connected with current source 101 and an output branch 105 series-connected with SPAD photodiode PD.

More particularly, in this example, the input branch 103 of the current mirror comprises an N-channel MOS transistor 107, also called input transistor, having its source coupled, for example, connected, to a node GND of application of a reference potential, for example, the ground, and having its drain coupled to a node of application of a positive power supply potential VALIM1 via current source 101. Transistor 107 is diode-mounted, that is, its drain and its gate are connected to each other. In the shown example, current source 101 has a first node or power supply node a1 coupled, for example, connected, to node VALIM1, and a second node or output node a2 coupled, for example, connected, to the drain of transistor 107.

In the example of FIG. 1, the output branch 105 of the current mirror comprises an N-channel MOS transistor 109, also called output transistor, having its source coupled, for example connected, to node GND, and having its drain coupled, for example, connected, to a node Vm. Node Vm is coupled, for example, connected, to the anode of SPAD photodiode PD. The gates of the input and output transistors 107 and 109 of the current mirror are coupled, for example, connected, to each other.

The cathode of SPAD photodiode PD is coupled, for example, connected, to a node of application of a positive bias potential VHV, greater than the avalanche voltage of the photodiode. As an example, the potential of node VHV is greater than the avalanche voltage of the photodiode by a value in the range from 0.5 to 10 volts. The potential of node VHV is for example in the range from 10 to 50 volts, for example, in the order of 25 volts.

The potential of node VALIM1 may be much smaller, for example, in the range from 1.8 to 5 volts, for example, in the order of 3.3 volts.

Figure 2:
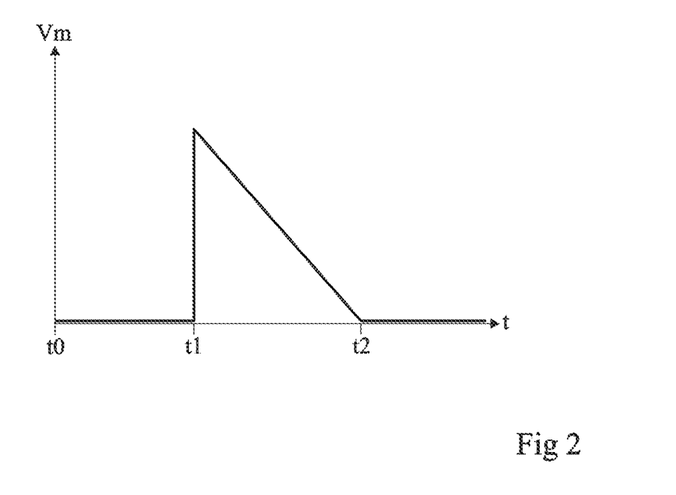
FIG. 2 is a diagram illustrating the operation of the circuit of FIG. 1.

FIG. 2 is a diagram schematically illustrating the operation of the circuit of FIG. 1. The diagram of FIG. 2 more particularly illustrates the variation, over time t (in abscissas), of the potential of node Vm (in ordinates) at the triggering of an avalanche in photodiode PD.

At a time t10 preceding the triggering of the avalanche, the potential of node Vm is at a low level, for example equal to the potential of node GND, for example, equal to 0 volt. Indeed, at this stage, photodiode PD is clamped, and the current imposed by current source 101, via the current mirror, draws the potential of node Vm substantially to the potential of node GND.

At a time t1, photodiode PD starts an avalanche under the effect of the injection of a photogenerated charge into its depletion area. A strong current then flows through the photodiode. This avalanche current, much greater than the current imposed in transistor 109 by current source 101, causes an abrupt rise in the potential of node Vm. The voltage across SPAD photodiode PD then very rapidly falls below the avalanche voltage of the photodiode, which results in interrupting the avalanche. The implementation of the avalanche detection function has not detailed, the described embodiments being compatible with usual avalanche detection circuits. As an example, the detection of the avalanche may be based on a detection of the abrupt rise of the potential of node Vm. As a variant, the detection of the avalanche may be based on a detection of a potential variation on the cathode side of the photodiode.

After time t1, the potential of node Vm decreases again under the effect of the current imposed by current source 101 to reach, at a time t2, a potential substantially equal to that of node GND. During this phase, the charges trapped in SPAD photodiode PD at the time when the avalanche is interrupted are discharged towards the reference node. At time t2, SPAD photodiode PD is depleted again and biased to a voltage greater than its avalanche voltage. In other words, SPAD photodiode PD is ready to start a new avalanche under the effect of an injection of a photogenerated charge into its depletion area.

The duration of the photodiode resetting phase, ranging from time t1 to time t2, is directly linked to the intensity of the current Ib delivered by current source 101 and imposed on node Vm via the current mirror. The higher current Ib, the more the charges trapped in the photodiode at time of the interruption of the avalanche are discharged rapidly, and the shorter the resetting phase. Thus, the higher current Ib, the higher the number of events capable of being detected by the device per time unit. Increasing current Ib however results in slowing down the rise of potential Vm in case of an avalanche (or even in preventing the rise of potential Vm to a value sufficiently high to interrupt the avalanche in the case where the value of current Ib is of the same order as the value of the avalanche current or greater than the value of the avalanche current). This results in an increase of the time required to detect the avalanche, as well as in an increase of the electric power consumption, linked to the fact that the avalanche is not interrupted immediately after its triggering. A compromise thus has to be found between the avalanche detection speed, the electric power consumption, and the resetting speed after the detection of an avalanche.

Figure 3:
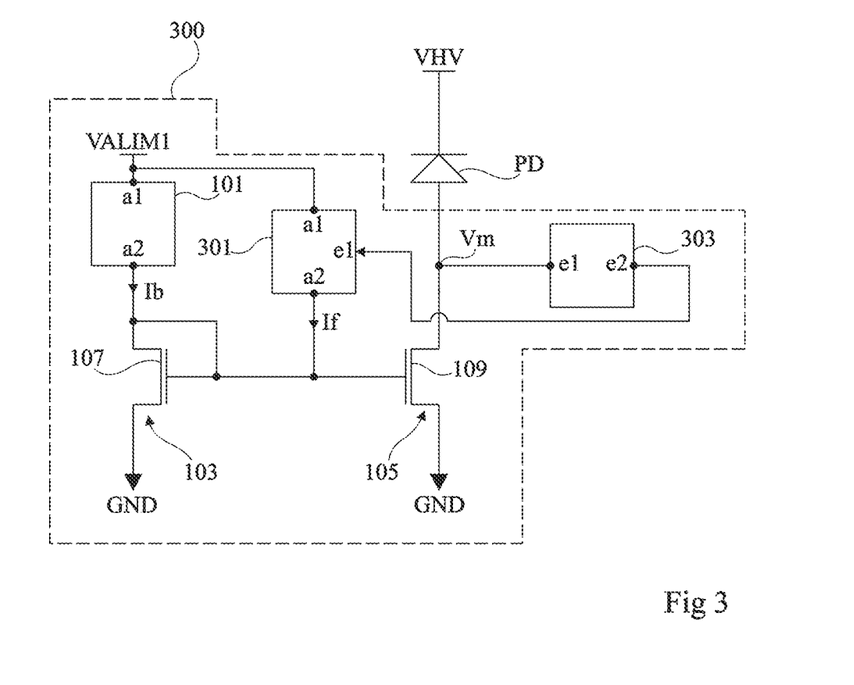
FIG. 3 schematically and partially shows an example of a SPAD photodiode control circuit according to an embodiment.

FIG. 3 schematically and partially shows an example of a circuit 300 for controlling a SPAD photodiode PD according to an embodiment.

The control circuit 300 of FIG. 3 comprises the same elements as the control circuit 100 of FIG. 1, arranged substantially in the same way. These elements will not be detailed again hereafter.

The control circuit 300 of FIG. 3 further comprises a second current source 301 series-connected with the input branch 103 of the current mirror, in parallel with current source 101. More particularly, in this example, current source 301 has a first node or power supply node a1 coupled, for example, connected, to node VALIM1, and a second node or output node a2 coupled, for example, connected, to the drain of transistor 107.

Current source 301 is controllable to, in a first configuration, called inactive state, deliver a substantially zero current and, in a second configuration, called active state, deliver a non-zero positive current If. When current source 301 is inactive, the current injected into the input branch 103 of the current is substantially equal to the current Ib delivered by current source 101. The current imposed by the current mirror on node Vm then is also substantially equal to current Ib. When current source 301 is active, the current injected into the input branch 103 of the current mirror is substantially equal to the sum of the current Ib delivered by current source 101 and of the current If delivered by current source 301. The current imposed by the current mirror on node Vm is then also substantially equal to the sum of currents Ib and If. Current source 301 has a control node e1 capable of receiving a control signal for controlling source 301 to the active or inactive state.

The control circuit 300 of FIG. 3 further comprises a feedback circuit 303 having an input node e1 coupled, for example, connected, to node Vm and an output node e2 coupled, for example, connected, to the control node e1 of current source 301. Feedback circuit 303 is configured to, in the absence of an avalanche, control current source 301 to the inactive state. In case of an avalanche, circuit 303 is adapted to detecting the crossing of a predetermined voltage threshold VTH by node Vm and then, after a predetermined delay after the crossing of threshold VTH, to controlling current source 301 to the active state. When the voltage on node Vm falls below threshold VTH, feedback circuit 303 controls current source 301 back to the inactive state, until the next avalanche.

Figure 4:
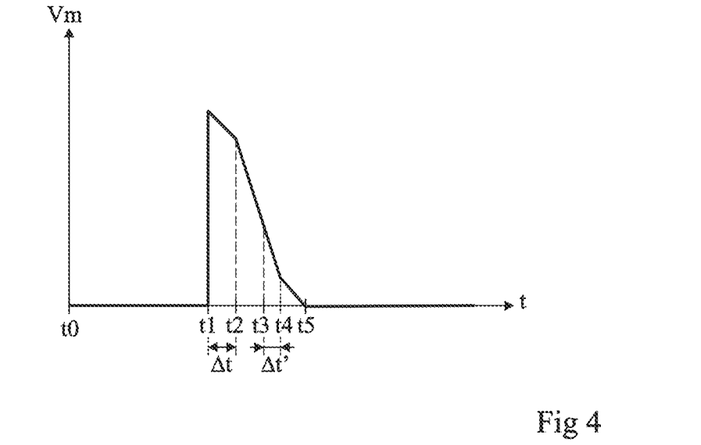
FIG. 4 is a diagram illustrating the operation of the circuit of FIG. 3.

FIG. 4 is a diagram schematically illustrating the operation of the circuit of FIG. 3. The diagram of FIG. 4 more particularly illustrates the variation over time t (in abscissas), of the potential of node Vm (in ordinates) at the triggering of an avalanche in photodiode PD.

As in the example described in relation with FIGS. 1 and 2, at a time t10 preceding the triggering of the avalanche, the potential of node Vm is at a low level, for example equal to the potential of node GND, for example, equal to 0 volt. Indeed, at this stage, photodiode PD is clamped, and the current Ib imposed by current source 101, via the current mirror, draws the potential of node Vm substantially to the potential of node GND. At this stage, current source 301 is inactive.

At a time t1, photodiode PD starts an avalanche under the effect of the injection of a photogenerated charge into its depletion area. A strong current then flows through the photodiode. This avalanche current, much greater than the current Ib imposed in transistor 109 by current source 101, causes an abrupt rise in the potential of node Vm. The potential of node Vm particularly almost instantaneously rises above the turn-on threshold VTH of feedback circuit 303. The voltage across SPAD photodiode PD further very rapidly falls below the avalanche voltage of the photodiode, which results in interrupting the avalanche.

After a predetermined delay Δt after the crossing of threshold VTH by the potential of node Vm, that is, at a time t2 substantially equal to t1+Δt, feedback circuit 303 controls the activation of current source 301.

After time t1, the potential of node Vm decreases under the effect of the current Ib imposed by current source 101 and the current mirror.

From time t2, the current If supplied by current source 301 adds to the current Ib supplied by current source 101, and the current imposed by the current mirror to node Vm becomes substantially equal to the sum of currents Ib and If. This results in an acceleration of the decrease of the potential of node Vm.

At a time t3 subsequent to time t2, the potential of node Vm falls back below the turn-on threshold VTH of feedback circuit 303.

After a predefined delay Δt' after time t3, that is, at a time t4 substantially equal to t3+Δt', feedback circuit 303 controls the deactivation of current source 301.

The potential of node Vm then keeps on decreasing, under the effect of current Ib only, to reach, at a time t5, a potential substantially equal to that of node GND.

At a time t5, SPAD photodiode PD is reset, that is, depleted again and biased to a voltage greater than its avalanche voltage, and ready to start an avalanche under the effect of an injection of a photogenerated charge into its depletion area.

The activation of current source 301 after the triggering of the avalanche enables to decrease the duration of the photodiode resetting phase (ranging in the present example from time t1 to time t5) with respect to the example of FIGS. 1 and 2. Further, current source 301 being inactive at the beginning of the avalanche, the rise of the potential of node Vm to a value sufficiently high to interrupt the avalanche is not slowed down with respect to the example of FIGS. 1 and 2.

More generally, the embodiment described in relation with FIGS. 3 and 4 enables to benefit from an additional degree of liberty to control the duration of the photodiode reset phase, as well as the applied waveform. This enables the charges accumulated in the SPAD photodiode at the triggering to possibly recombine and to avoid parasitic retriggering phenomena due to the presence of residual charges in the SPAD photodiode. Indeed, when the potential of node Vm decreases, the electric field does not necessarily increase uniformly within the SPAD photodiode. Potential pockets which briefly retain the charges may locally create. These may retrigger an avalanche if the electric field increases too fast. The field rise must thus be controlled, while ascertaining to well remove all charges. In practice, the waveform to be applied may be adapted on a case-by-case basis according to the considered SPAD technology.

Figure 5:
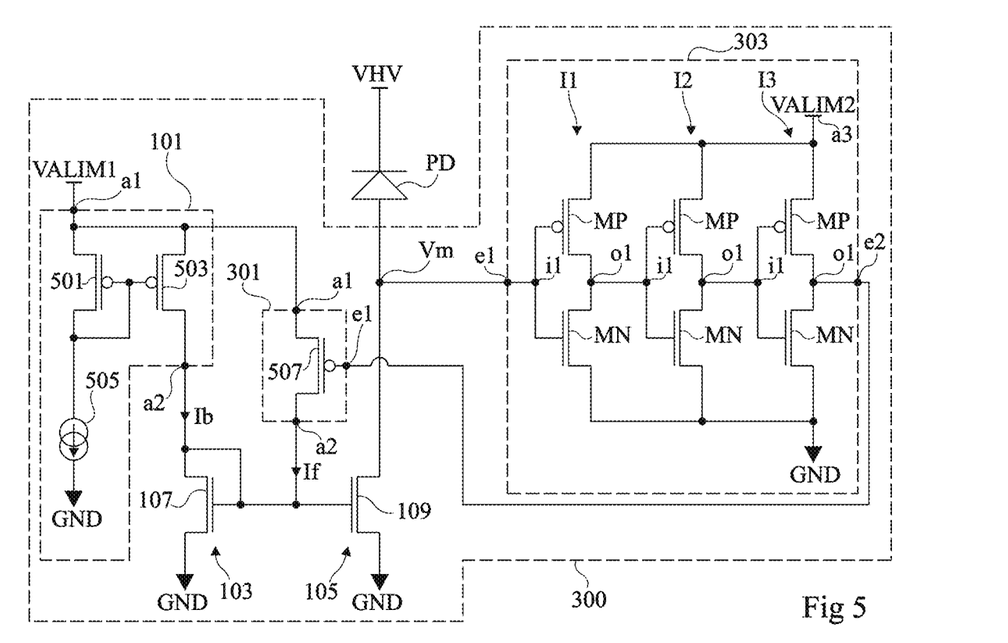
FIG. 5 illustrates an embodiment of the control circuit of FIG. 3.

FIG. 5 is an electric diagram illustrating in further detail an embodiment of the control circuit 300 of FIG. 3. FIG. 5 more particularly illustrates an embodiment of current source 101, an embodiment of current source 301, and an embodiment of the feedback circuit 303 of the control circuit 300 of FIG. 3.

In the example of FIG. 5, current source 101 comprises a current mirror comprising an input transistor 501 and an output transistor 503. In the shown example, transistors 501 and 503 are P-channel MOS transistors. Transistor 501 has its source coupled, for example, connected, to the power supply node a1 of current source 101, and its drain coupled to node GND via a current source 505. Current source 505 is for example a resistor having a first end coupled, for example, connected, to the drain of transistor 501 and a second end coupled, for example connected, to node GND. As a variant, current source 505 may be a MOS transistor having a first conduction node (source or drain) coupled, for example connected, to the drain of transistor 501, and a second conduction node (drain or source) coupled, for example, connected, to node GND. Transistor 501 is diode-mounted, that is, its drain and its gate are connected to each other. In this example, transistor 503 has its source coupled, for example, connected, to the power supply node a1 of current source 101, and its drain coupled, for example, connected, to the output node a2 of current source 101. The gates of transistors 501 and 503 are connected to each other.

As a variant, fixed current source 505 may be arranged between the source of transistor 501 and node a1, or between the drain of transistor 503 and node a2.

In the example of FIG. 5, current source 301 comprises a MOS transistor 507 coupled, by its conduction nodes, respectively to the nodes a1 and a2 of current source 301. In the shown example, transistor 507 is a P-channel MOS transistor having its source coupled, for example, connected, to the power supply node a1 of current source 301, and having its drain coupled, for example, connected, to the output node a2 of current source 301. The gate of transistor 507 is coupled, for example, connected, to the control node e1 of current source 301.

In the example of FIG. 5, feedback circuit 303 comprises three inverters I1, I2, and I3 series-connected between the input node e1 and the output node e2 of the feedback circuit. The turn-on threshold VTH of the feedback circuit corresponds to the switching threshold of inverter I1. When the potential of node Vm is in a low state, that is, smaller than threshold VTH, the output of inverter I3 is in a high state, corresponding to a signal for controlling transistor 507 to the off state. The current supplied by transistor 507 is then substantially zero. Current source 301 then is in the inactive state. When the potential of node Vm is in a high state, that is, greater than threshold VTH, the output of inverter I3 is in a low state, corresponding to a signal for controlling transistor 507 to the on state. Transistor 507 then delivers a current which is a function of its dimensions and particularly of its channel width, corresponding to the output current If of current source 301. Current source 301 then is in the active state. The delay Δt between the time of crossing of threshold VTH by the potential of node Vm and the time of activation of current source 301 corresponds in this example to the time of propagation of the high state of node Vm through the chain of inverters.

In the shown example, each of inverters I1, I2, and I3 comprises a P-channel MOS transistor MP in series with an N-channel MOS transistor MN. Transistor MP has its source coupled, for example, connected, to a node a3 of application of a positive power supply potential VALIM2, for example, equal to potential VALIM1, and its drain coupled, for example, connected, to the drain of transistor MN. The source of transistor MN is coupled, for example, connected, to node GND. The gates of transistors MP and MN are coupled, for example, connected, to a same input node it of the inverter. The drains of transistors MP and MN are coupled, for example, connected, to a same output node o1 of the inverter. The input node it of inverter I1 is coupled, for example, connected, to the input node e1 of circuit 303.

The output node o1 of inverter I1 is coupled, for example, connected, to the input node it of inverter I2. The output node o1 of inverter I2 is coupled, for example, connected, to the input node it of inverter I3. The output node o1 of inverter I3 is coupled, preferably connected, to the output node e2 of circuit 303.

The delay t between the switching to the high state of the potential of node Vm and the activation of current source 301 is particularly determined by the switching times of the transistor MN of inverter I1, of the transistor MP of inverter I2, and of the transistor MN of inverter I3. The sizing of these transistors may be selected to obtain the desired delay Δt, particularly to ensure the interruption of the avalanche before the activation of current source 301. The switching times of the transistor MP of inverter I1, of the transistor MN of inverter I2, and of the transistor MP of inverter I3 determine the delay Δt' between the switching to the low state of node Vm and the deactivation of current source 301. This delay may be different from delay Δt, for example, shorter than delay Δt.

Of course, according to the value of the desired delay Δt, the number of inverters series-coupled between nodes e1 and e2 of feedback circuit 303 may be different from three. Further, if the number of inverters series-coupled between nodes e1 and e2 of feedback circuit 303 is an even number, the transistor 507 of current source 301 may be replaced with an N-channel MOS transistor.

Figure 6:
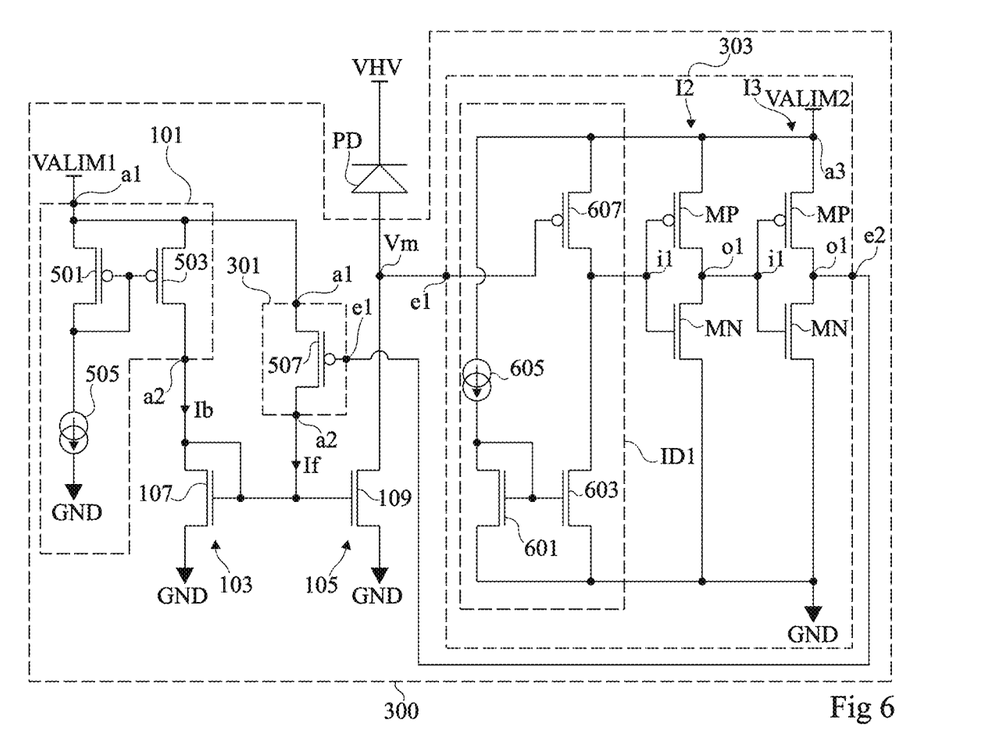
FIG. 6 illustrates another embodiment of the control circuit of FIG. 3.

FIG. 6 is an electric diagram illustrating another embodiment of the control circuit 300 of FIG. 3. The control circuit 300 of FIG. 6 differs from the control circuit 300 of FIG. 5 essentially by the implementation of feedback circuit 303.

More particularly, the feedback circuit 303 of FIG. 6 differs from the feedback circuit 303 of FIG. 5 in that, in the example of FIG. 6, the inverter I1 of the feedback circuit 303 of FIG. 5 is replaced with a delay inverter circuit ID1.

Circuit ID1 comprises a current mirror comprising an input transistor 601 and an output transistor 603. In the shown example, transistors 601 and 603 are N-channel MOS transistors. Transistor 601 has its source coupled, for example connected, to node GND, and its drain coupled to power supply node a3 via a current source 605. Current source 605 is for example a resistor having a first end coupled, for example, connected to the drain of transistor 601 and a second end coupled, for example, connected to node a3. As a variant, current source 605 may be a MOS transistor having a first conduction node (source or drain) coupled, for example, connected, to the drain of transistor 601, and a second conduction node (drain or source) coupled, for example, connected, to node a3. Transistor 601 is diode-mounted, that is, its drain and its gate are connected to each other.

In this example, transistor 603 has its source coupled, for example, connected, to node GND, and its drain coupled to node a3 via a P-channel MOS transistor 607. More particularly, in this example, transistor 607 has its source coupled, for example, connected, to node a3 and its drain coupled, for example, connected, to the drain of transistor 603.

The gates of transistors 601 and 603 are connected to each other.

Further, in this example, the gate of transistor 607 is coupled, for example, connected, to the input node e1 of feedback circuit 303. The drains of transistors 607 and 603 are coupled, for example, connected, to the input node it of inverter I2.

The operation of the feedback circuit 303 of FIG. 6 is similar to that of the feedback circuit 303 of FIG. 5, with the difference that, in the example of FIG. 6, when the potential of node Vm switches from the low state (smaller than threshold VTH) to the high state (greater than threshold VTH), the current in transistor 603 is limited to a value imposed by current source 605. A delay is thus introduced between the time of switching of the potential of node Vm from the low state to the high state, and the time of switching of the potential of the input node it of inverter I2 from the high state to the low state. This delay is all the longer as the current set by current source 605 is small.

Figure 7:
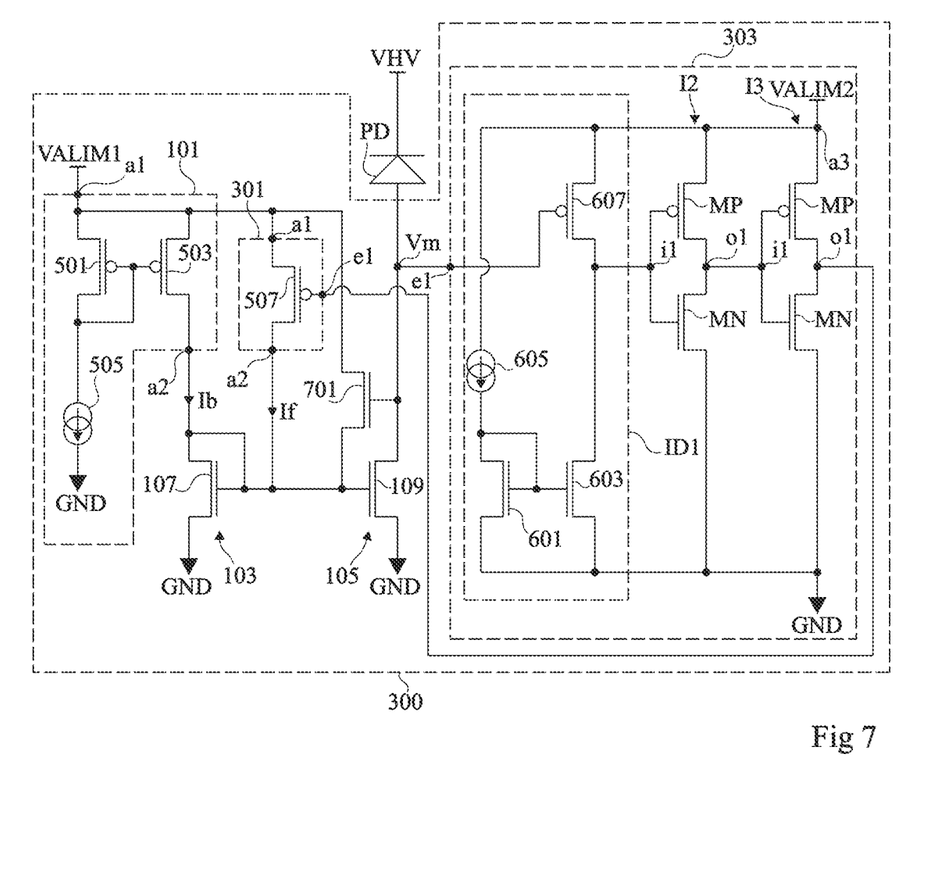
FIG. 7 illustrates still another embodiment of the control circuit of FIG. 3.

FIG. 7 is an electric diagram illustrating another embodiment of the control circuit 300 of FIG. 3. The control circuit 300 of FIG. 7 comprises the same elements as the control circuit of FIG. 6, arranged substantially in the same way.

The control circuit 300 of FIG. 7 differs from the control circuit 300 of FIG. 6 in that it further comprises a MOS transistor 701 series-connected between the input branch 103 of the current mirror formed by transistors 107 and 109, in parallel with current sources 101 and 301. More particularly, in this example, transistor 701 is an N-channel transistor having its drain coupled, for example, connected, to the power supply node a1 of current source 101 and having its source coupled, for example, connected, to the output node a2 of current source 101. The gate of transistor 701 is connected to node Vm.

Transistor 701 is controlled to the on state when the potential on node Vm is in a high state, and to the off state when the potential on node Vm is in a low state. Thus, transistor 701 is controlled by direct feedback (with no delay) according to the potential of node Vm. This enables to accelerate the discharge of the charges trapped in photodiode PD at the beginning of the photodiode reset phase. More particularly, the current in transistor 701 abruptly increases at the starting of the SPAD photodiode, and then decreases after the clamping of SPAD photodiode during the fall of the potential of node Vm. Current source 301 and feedback circuit 303 enable, after a fixed delay Δt set by circuit 303, to re-increase the SPAD photodiode reset current.

It should be noted that a direct feedback transistor such as the transistor 701 described in the example of FIG. 7 may be provided whatever the retained implementation of feedback circuit 303, for example, with the implementation of the circuit 303 described in relation with FIG. 5.

Figure 8:
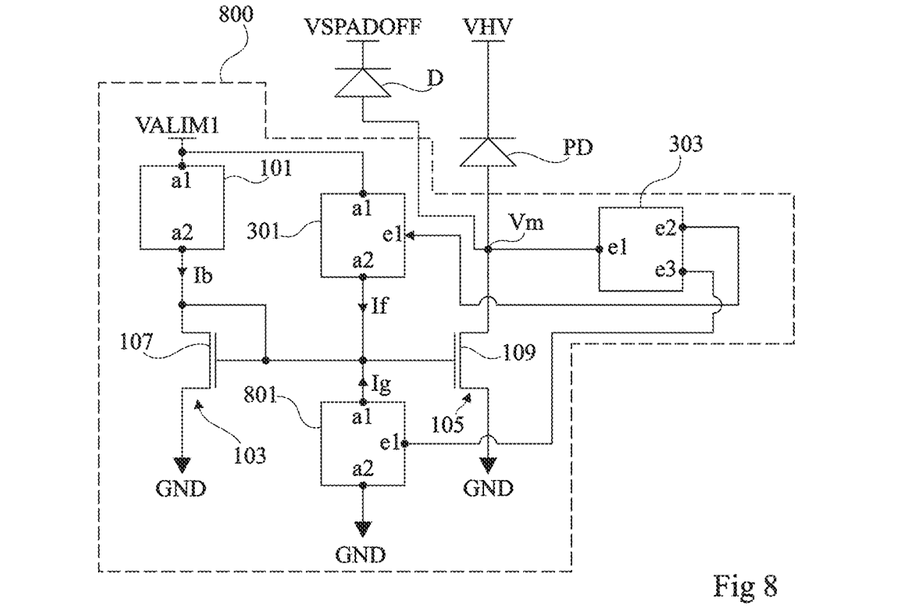
FIG. 8 schematically and partially shows another example of a SPAD photodiode control circuit according to an embodiment.

FIG. 8 schematically and partially shows an example of a circuit 800 for controlling a SPAD photodiode PD according to an embodiment.

The control circuit 800 of FIG. 8 comprises the same elements as the control circuit 800 of FIG. 3, arranged substantially in the same way. These elements will not be detailed again hereafter.

The control circuit 800 of FIG. 8 further comprises a third current source 801 connected between the midpoint of the current mirror and reference node GND. More particularly, in this example, current source 801 has a first node a1 coupled, for example, connected, to the drain of transistor 107, and a second node a2 coupled, for example, connected, to node GND.

Current source 801 is controllable to, in a first configuration, called active state, take the potential of the midpoint of the current mirror (connected to the drain and to the gate of transistor 107 and to the gate of transistor 109) substantially at the reference potential of node GND and, in a second configuration, called inactive state, isolate the midpoint of the current mirror from reference node GND. In other words, in the active state, current source 801 imposes a negative current Ig which subtracts to and compensates the positive current Ib applied by current source 101. This enables to completely interrupt the current in the output branch 105 of the current mirror, and thus allow an even faster rise of node Vm, and thus a faster quenching of SPAD photodiode PD. In the inactive state, current Iq is substantially equal to zero, and the operation is similar to what has been previously described. Current source 801 has a control node e1 capable of receiving a control signal for controlling source 801 to the active or inactive state.

In the example of FIG. 8, feedback circuit 303 has a second output node e3 coupled, for example, connected, to the control node e1 of current source 801. Feedback circuit 303 is configured to, in the absence of an avalanche, control current source 301 to the inactive state (current If equal to zero or substantially zero) and current source 801 to the inactive state (current Ig equal to zero or substantially zero). In case of an avalanche, circuit 303 is adapted to detecting the crossing of a predetermined voltage threshold VTH by node Vm. Circuit 303 then immediately controls current source 801 to the active state. The negative current Ig delivered by current source 801 then compensates the positive current Ib supplied by current source 101, which amounts to canceling the current imposed by the current mirror on node Vm. This increases the rise speed of the potential of node Vm, until the quenching of the SPAD photodiode. Similarly to what has been previously described, after a predetermined delay after the crossing of threshold VTH, feedback circuit 303 controls current source 801 to the inactive state, and controls source 301 to the active state. This enables to relatively rapidly decrease the potential of node Vm (phase of resetting of the SPAD photodiode). In the same way as what has been previously described, when the voltage on node Vm falls back below threshold VTH, feedback circuit 303 controls current source 301 to the inactive state again, until the next avalanche.

In FIG. 8, a diode D having its anode coupled, for example, connected, to node Vm and having its cathode coupled, for example, connected, to a node of application of a fixed positive bias potential VSPADOFF, greater than the potential of node GND, for example, a potential in the range from 5 to 10 volts, for example, in the order of 7 volts, has further been shown. Diode D provides a discharge path for the avalanche current. Thus, when the potential of node Vm reaches potential VSPADOFF, the excess current which has not been discharged by the output branch 105 of the current mirror is discharged by diode D. Potential VSPADOFF is selected to be sufficiently high to guarantee the quenching of the avalanche. In particular, potential VSPADOFF is selected to be such that difference VHV-VSPADOFF is smaller than the avalanche voltage of the SPAD photodiode.

Figure 9:
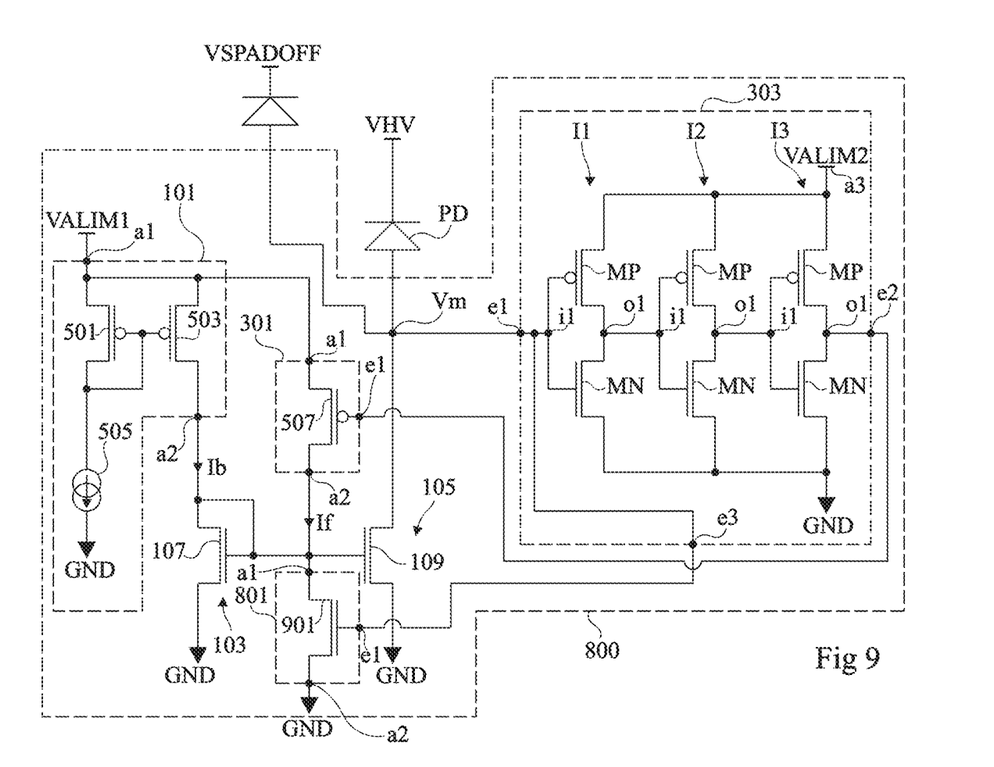
FIG. 9 illustrates an embodiment of the control circuit of FIG. 8.

FIG. 9 is an electric diagram illustrating in further detail an embodiment of the control circuit 800 of FIG. 8. FIG. 9 more particularly shows an embodiment of current source 101, an embodiment of current source 301, an embodiment of current source 801, and an embodiment of the feedback circuit 303 of the control circuit 800 of FIG. 8.

In this example, current source 101, current source 301, and feedback circuit 303 comprise the same elements as in the example of FIG. 5, arranged substantially in the same way.

In the example of FIG. 8, current source 801 comprises a MOS transistor 901 coupled, by its conduction nodes, respectively to the nodes a1 and a2 of current source 801. In the shown example, transistor 901 is an N-channel MOS transistor having its source coupled, for example, connected, to the node a2 of current source 801, and having its drain coupled, for example, connected, to the node a1 of current source 801. The gate of transistor 901 is coupled, for example, connected, to the control node e1 of current source 801.

In the example of FIG. 8, the input terminal e1 of feedback circuit 303 is directly connected to its output terminal e3. Thus, the gate of transistor 901 is connected to node Vm. The rise of the potential of node Vm at the beginning of the avalanche results in almost immediately turning on transistor 901 (making it conductive), thus activating current source 801. Transistor 901 is sized to be relatively resistive. Thus, when current source 301 is activated by feedback circuit 303 (after the delay Δt corresponding, in this example, to the propagation time in the chain of inverters I1, I2, I3), transistor 901 cannot fully absorb the sum of the currents Ib and If delivered by current sources 101 and 301. A current then starts flowing through the output branch 105 of the current mirror. This results in lowering the potential of node Vm and thus in making transistor 901 more resistive. The more the potential of node Vm decreases, the more transistor 901 becomes resistive, and the more the current in the output branch 105 of the current mirror becomes significant, and this, until the turning off of transistor 901 (switching to the inactive state of source 801).

More generally, other implementations of current source 801 and of the feedback loop used to control current source 801 may be provided.

It should further be noted that the example of implementation of the current source 801 of FIG. 9 is compatible with the alternative embodiments of FIGS. 6 and 7.

Various embodiments and variants have been described. Those skilled in the art will understand that certain features of these various embodiments and variants may be combined, and other variants will occur to those skilled in the art. In particular, the described embodiments are not limited to the above-described examples of implementation of feedback circuit 303. More generally, it will be within the abilities of those skilled in the art to provide other embodiments of circuit 303 capable of controlling the activation of current source 301 after a delay Δt after the triggering of an avalanche.

Further, although only embodiments where the input node of feedback circuit 303 is directly connected to the anode of SPAD photodiode PD have been shown in the drawings, the described embodiments are not limited to this specific case. As a variant, the input node e1 of feedback circuit 303 may be coupled to the anode of SPAD photodiode PD via a capacitive link.

In another variant, the input node e1 of feedback circuit 303 may be coupled, not to the anode but to the cathode of SPAD photodiode PD. As an example, the cathode of the SPAD photodiode may be coupled to the node of application of potential VHV via a resistive element (for example, a resistor) and the input node e1 of feedback circuit 303 may be coupled to an intermediate node between the resistive element and the cathode of the photodiode via a capacitive element (for example, a capacitor).

Further, the described embodiments are not limited to the above-described examples of forming of current source 101 and of controllable current source 301.

It should in particular be noted that as a variant, all the conductivity types of the MOS transistors of the described circuits may be inverted, with circuits 303, 301 and, possibly, 701, coupled, for example, connected, no longer to the anode but to the cathode of SPAD photodiode PD. In this case, voltages VHV, VALIM1, and VALIM2 may be negative voltages (referenced with respect to the potential of node GND).

It should further be noted that transistor 109 may be cascoded with one or a plurality of other transistors. In this case, node Vm may preferably correspond to the drain node of transistor 109.

The invention claimed is:

1. SPAD photodiode control circuit comprising:
a first current source;
a current mirror comprising an input transistor in series with the first current source and an output transistor in series with the SPAD photodiode; and
a second current source in series with the input transistor of the current mirror and in parallel with the first current source, the second current source being controllable to a so-called inactive state where it delivers no current, and to a so-called active state where it delivers a non-zero current which adds, in the input transistor of the current mirror, to a current delivered by the first current source; and
a feedback circuit configured to, after each triggering of an avalanche in the SPAD photodiode, control the second current source to the active state during a phase of resetting of the SPAD photodiode, and then control the second current source to the inactive state until the next triggering of an avalanche in the SPAD photodiode.

2. Circuit according to claim 1, wherein the feedback circuit is configured to introduce a predetermined delay between the triggering of an avalanche and the control to the active state of the second current source.

3. Circuit according to claim 1, wherein the feedback circuit has an input node coupled to an anode or cathode electrode of the SPAD photodiode, and an output node coupled to a control node of the second current source.

4. Circuit according to claim 3, wherein the input node of the feedback circuit is directly connected to said anode or cathode electrode of the photodiode.

5. Circuit according to claim 3, wherein the input node of the feedback circuit is connected to said anode or cathode electrode of the photodiode via a capacitive link.

6. Circuit according to claim 3, wherein the feedback circuit comprises a chain of inverters capable of propagating onto its output node a state change of a potential applied to its input node.

7. Circuit according to claim 6, wherein the chain of inverters comprises a delay inversion circuit.

8. Circuit according to claim 3, further comprising a direct feedback circuit in series with the input transistor of the current mirror and in parallel with the first and second current sources, said direct feedback transistor having a control node connected to the input node of the feedback circuit.

9. Circuit according to claim 1, further comprising a third current source connected between an output terminal of the first current source and a reference node, the third current source being controllable to a so-called active state where it delivers a non-zero current which subtracts, in the input transistor of the current mirror, to the current delivered by the first current source, and to a so-called inactive state where it delivers no current.

10. Circuit according to claim 9, wherein the feedback circuit is configured to, after each triggering of an avalanche in the SPAD photodiode, control the third current source to the active state before the beginning of the SPAD photodiode resetting phase, and then control the third current source to the inactive state during the resetting phase.

11. Circuit according to claim 9, wherein the third current source is a MOS transistor controllable to the active state and to the inactive state via its gate.

12. Circuit according to claim 1, wherein the second current source is a MOS transistor controllable to the active state and to the inactive state via its gate.

13. Circuit according to claim 1, wherein the input and output transistors of the current mirror are MOS transistors, the gates of the input and output transistors of the current mirror being connected to each other and the drain and the gate of the input transistor of the current mirror being connected to each other.

\* \* \* \* \*